(12) United States Patent
Ogawa

(10) Patent No.: US 9,129,960 B2
(45) Date of Patent: Sep. 8, 2015

(54) SEMICONDUCTOR DEVICE AND MANUFACTURING METHOD THEREOF

(71) Applicant: FUJI ELECTRIC CO., LTD., Kawasaki-shi (JP)

(72) Inventor: Shogo Ogawa, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/220,318

(22) Filed: Mar. 20, 2014

(65) Prior Publication Data

US 2014/0231982 A1    Aug. 21, 2014

Related U.S. Application Data

(63) Continuation of application No. PCT/JP2012/073582, filed on Sep. 14, 2012.

(30) Foreign Application Priority Data

Sep. 30, 2011    (JP) .................................. 2011-216512

(51) Int. Cl.
  *H01L 23/10*    (2006.01)
  *H01L 23/34*    (2006.01)
  (Continued)

(52) U.S. Cl.
  CPC .............. *H01L 23/50* (2013.01); *H01L 23/053* (2013.01); *H01L 23/34* (2013.01); *H01L 23/36* (2013.01);
  (Continued)

(58) Field of Classification Search
  CPC ................... H01L 2224/73265; H01L 25/072; H01L 23/3107; H01L 23/49568; H01L 2224/40137

USPC ........... 257/706, 707, 723, 724; 438/107, 122
  See application file for complete search history.

(56) References Cited

U.S. PATENT DOCUMENTS

| | | | | |
|---|---|---|---|---|
| 2002/0113302 | A1* | 8/2002 | Shinohara ..................... | 257/678 |
| 2004/0007772 | A1* | 1/2004 | Arai et al. ..................... | 257/691 |

(Continued)

FOREIGN PATENT DOCUMENTS

| | | |
|---|---|---|
| EP | 0828341 A2 | 3/1998 |
| EP | 1755163 A1 | 2/2007 |

(Continued)

OTHER PUBLICATIONS

International Search Report issued in PCT/JP2012/073582, dated Dec. 4, 2012. References cited in the ISR were previously submitted in an SBO8a Form. English translation is provided.

(Continued)

*Primary Examiner* — Sheila V Clark
(74) *Attorney, Agent, or Firm* — Rossi, Kimms & McDowell LLP

(57) ABSTRACT

A circuit assembly is disclosed which includes first and second substrates disposed on a heat dissipation base, and first and second semiconductor elements mounted on the first and second substrates. The first and second substrates are wired together, and three main electrode terminals are provided when the first and second semiconductor elements are connected in series, while two main electrode terminals are provided when the first and second semiconductor element are connected in parallel. In both cases, the circuit assembly is covered with a common exterior case so that one portion of each main electrode terminal or one portion of each main electrode terminal is exposed. Parts used in the circuit assembly are shared, and by changing the wiring between the first and second substrates, semiconductor modules with different functions are realized at low cost.

10 Claims, 13 Drawing Sheets

(51) Int. Cl.
H01L 23/50 (2006.01)
H01L 23/053 (2006.01)
H01L 23/498 (2006.01)
H01L 25/07 (2006.01)
H01L 23/00 (2006.01)
H01L 23/36 (2006.01)
H01L 23/373 (2006.01)
H01L 25/18 (2006.01)

(52) U.S. Cl.
CPC ...... *H01L 23/3735* (2013.01); *H01L 23/49811* (2013.01); *H01L 24/80* (2013.01); *H01L 25/072* (2013.01); *H01L 25/18* (2013.01); *H01L 2224/32225* (2013.01); *H01L 2224/48091* (2013.01); *H01L 2224/48137* (2013.01); *H01L 2224/48227* (2013.01); *H01L 2224/4903* (2013.01); *H01L 2224/73265* (2013.01); *H01L 2924/1305* (2013.01); *H01L 2924/13055* (2013.01); *H01L 2924/19107* (2013.01); *H01L 2924/3011* (2013.01)

(56) References Cited

U.S. PATENT DOCUMENTS

2007/0284719 A1* 12/2007 Shiota et al. ............... 257/687
2008/0158924 A1 7/2008 Rinehart et al.
2008/0217760 A1 9/2008 Yoshihara et al.
2009/0140414 A1 6/2009 Soyano et al.
2013/0093082 A1* 4/2013 Okumura et al. ............. 257/737
2013/0161801 A1* 6/2013 Otremba et al. ............. 257/668
2014/0346659 A1* 11/2014 Nakamura et al. ........... 257/704

FOREIGN PATENT DOCUMENTS

| JP | 2002184940 A | 6/2002 |
| JP | 2003-289130 A | 10/2003 |
| JP | 2004-235566 A | 8/2004 |
| JP | 2007-115946 A | 5/2007 |
| JP | 2008252055 A | 10/2008 |
| JP | 2009-141000 A | 6/2009 |
| JP | 2010225757 A | 10/2010 |

OTHER PUBLICATIONS

European Search Report issued in European Application No. 12835830 dated May 29, 2015.
Office Action issued in JP2013-536169, mailed Jul. 14, 2015.
International Search Report issued in PCT/JP2012/073582, dated Dec. 4, 2012. References cited in the ISR were previously submitted in an SB08a Form. English translation is provided.

* cited by examiner

SEMICONDUCTOR DEVICE AND MANUFACTURING METHOD THEREOF

BACKGROUND OF THE INVENTION

A. Field of the Invention

The present invention relates to a semiconductor device and a manufacturing method thereof.

B. Description of the Related Art

One type of semiconductor device (semiconductor module) is know in which semiconductor elements such as power semiconductors are mounted on a substrate, disposed on a heat dissipation base, which has conductor patterns, and the heat dissipation base is covered with an exterior case. As this semiconductor device, there is, for example, an IGBT module wherein insulated gate bipolar transistors (IGBTs) are mounted as semiconductor elements.

With regard to this kind of semiconductor module, a technology is known using an exterior case thereof wherein a terminal frame of a predetermined shape (including external connection terminals) electrically connected to semiconductor elements mounted inside the exterior case is insert molded using a resin. Also, a technology is known whereby a resin case with terminal mounting holes provided therein in advance is prepared, and when assembling a semiconductor module, external connection terminals are mounted in the terminal mounting holes of the resin case.

A plurality of semiconductor elements are electrically connected and mounted on a semiconductor module so as to realize a predetermined function of the semiconductor module in conjunction with each other in accordance with the use of the semiconductor module. The plurality of semiconductor elements, apart from being electrically connected via conductor patterns on a substrate on which the semiconductor elements are mounted, are electrically connected by utilizing, for example, the previously described terminal frame. The semiconductor device described in JP-A-2003-289130 is an example of this.

Meanwhile, in the heretofore described kind of semiconductor module including a plurality of semiconductor elements, in some cases, the realization of different functions is carried out not by changing the kind of semiconductor elements to be used, but by changing the relation of electrical connection of the semiconductor elements (for example, a series connection and a parallel connection). For example, in an IGBT module, when a plurality of substrates, each having conductor patterns on which IGBT chips are mounted as semiconductor elements, are disposed on a heat dissipation base, there are a case in which the IGBTs disposed on the plurality of substrates are connected in series to configure the IGBT module, and a case in which the IGBTs disposed on the plurality of substrates are connected in parallel to configure the IGBT module.

However, in order to realize this kind of semiconductor module, a change of the conductor patterns on the substrates, a change of the wiring (wire connection) between the semiconductor elements and conductor patterns along with the change of the conductor patterns, and the like, are carried out. Also, for example, when using an exterior case wherein the heretofore described kind of terminal frame is insert molded, it is necessary to change the shape of the terminal frame, or it is necessary to separately prepare an exterior case wherein the changed terminal frame is insert molded.

In this way, when obtaining semiconductor modules with different functions, even though the kind of semiconductor elements to be used is the same, it may happen that the costs necessary for materials and assembly increase by preparing parts (substrates, an exterior case, and the like) used for each semiconductor module.

The present invention is directed to overcoming or at least reducing the effects of one or more of the problems set forth above.

SUMMARY OF THE INVENTION

According to one aspect of the invention, there is provided a semiconductor device including a heat dissipation base; a first substrate, disposed on the heat dissipation base, which has a first conductor pattern; a second substrate, disposed on the heat dissipation base, which has a second conductor pattern; a first semiconductor element, disposed on the first substrate, which has on the first conductor pattern a first collector terminal and a first emitter terminal; a second semiconductor element, disposed on the second substrate, which has on the second conductor pattern a second collector terminal and a second emitter terminal; a plurality of electrode terminals which are connected one each to the first collector terminal, second emitter terminal, and second collector terminal in a first case in which the first emitter terminal and second collector terminal are wired together, and which are connected one each to the first collector terminal and second emitter terminal in a second case in which the first collector terminal and second collector terminal are wired together and the first emitter terminal and second emitter terminal are wired together; and a common exterior case which covers the heat dissipation base with one portion of each of the connected electrode terminals exposed in both the first case and second case.

Also, according to one aspect of the invention, there is a semiconductor device manufacturing method including a step of disposing on a heat dissipation base a first substrate having a first conductor pattern; a step of disposing on the heat dissipation base a second substrate having a second conductor pattern; a step of disposing on the first substrate a first semiconductor element having a first emitter terminal and a first collector terminal on the first conductor pattern; a step of disposing on the second substrate a second semiconductor element having a second emitter terminal and a second collector terminal on the second conductor pattern; a step of wiring the first emitter terminal and second collector terminal together, or wiring the first collector terminal and second collector terminal together, and wiring the first emitter terminal and second emitter terminal together; a step of connecting a plurality of electrode terminals, one each, to the first collector terminal, second emitter terminal, and second collector terminal in a first case in which the first emitter terminal and second collector terminal are wired together, and, one each, to the first collector terminal and second emitter terminal in a second case in which the first collector terminal and second collector terminal are wired together, and the first emitter terminal and second emitter terminal are wired together; and a step of covering the heat dissipation base with a common exterior case, with one portion of each of the connected electrode terminals exposed, in both the first case and second case.

According to the disclosed semiconductor device and manufacturing method thereof, by predetermined terminals being wired together, semiconductor devices with different functions are realized, and it is possible to realize these kinds of semiconductor devices with different functions at low cost by sharing parts.

The heretofore described and other objects, features, and advantages of the invention will be clarified by the following description relating to the attached drawings illustrating a preferred embodiment as an example of the invention.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1A:
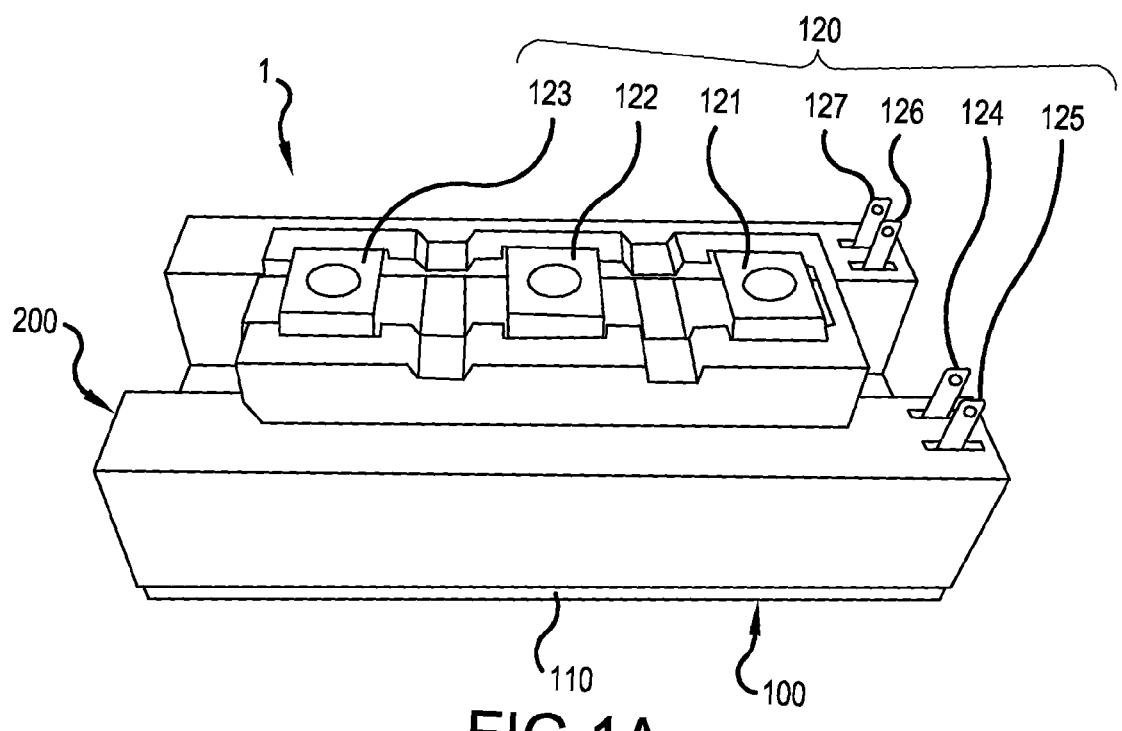
FIGS. 1A and 1B are schematic external views of one example of a semiconductor device.
Figure 1B:
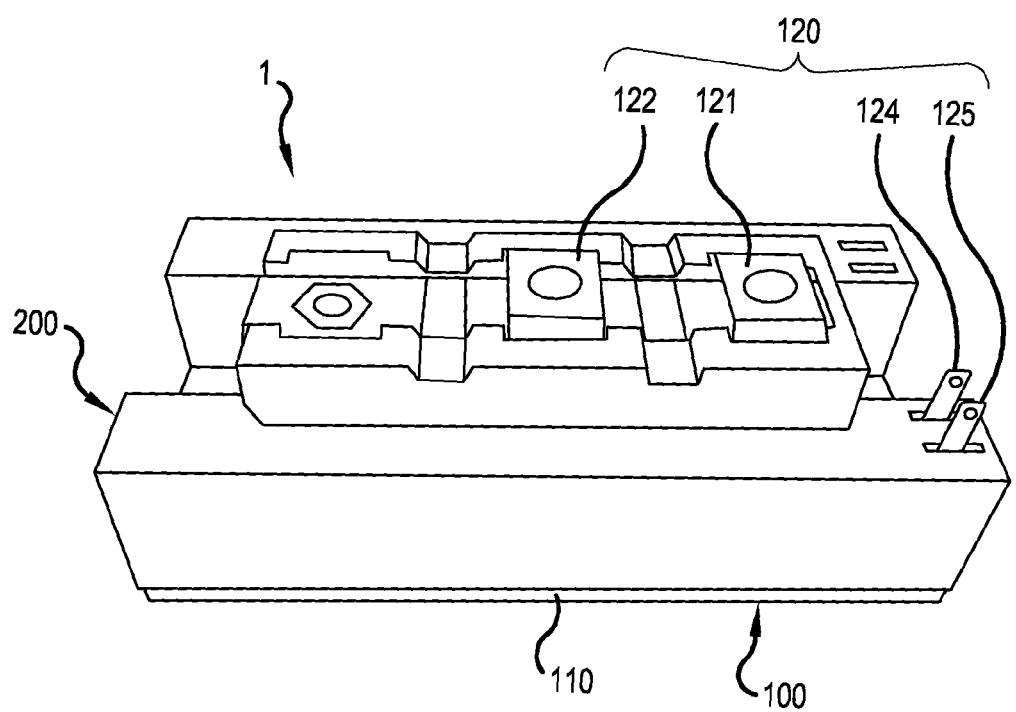

FIG. 1 is a schematic external view of one example of a semiconductor device. A semiconductor device (a semiconductor module) 1 shown in FIG. 1 has a structure wherein circuit assembly 100 including semiconductor elements (chips) and the like is covered with exterior case 200.

Circuit assembly 100, including a heat dissipation base 110, has a configuration wherein kinds of insulating circuit substrates (for example, DCB (direct copper bonding) substrates) and chips to be described hereafter are mounted on heat dissipation base 110. A plurality of electrode terminals 120 are electrically connected to the DCB substrates and chips of this kind of circuit assembly 100.

(A) of FIG. 1 shows a case in which three main electrode terminals 121, 122, and 123 and four auxiliary electrode terminals 124, 125, 126, and 127 are provided as the electrode terminals 120. (B) of FIG. 1 shows a case in which two main electrode terminals 121 and 122 and two auxiliary electrode terminals 124 and 125 are provided as the electrode terminals 120. These electrode terminals 120 are provided so that the upper end portions thereof are exposed from exterior case 200, and used as the external connection terminals of semiconductor module 1.

Exterior case 200 is formed using an insulating material such as a resin. Exterior case 200 is formed by a method, such as resin molding, so as to have a shape such that the respective upper end portions of the electrode terminals 120 are exposed to the exterior, as heretofore described.

Hereafter, a detailed description will be given of the heretofore described kind of semiconductor module.

Figure 2A:
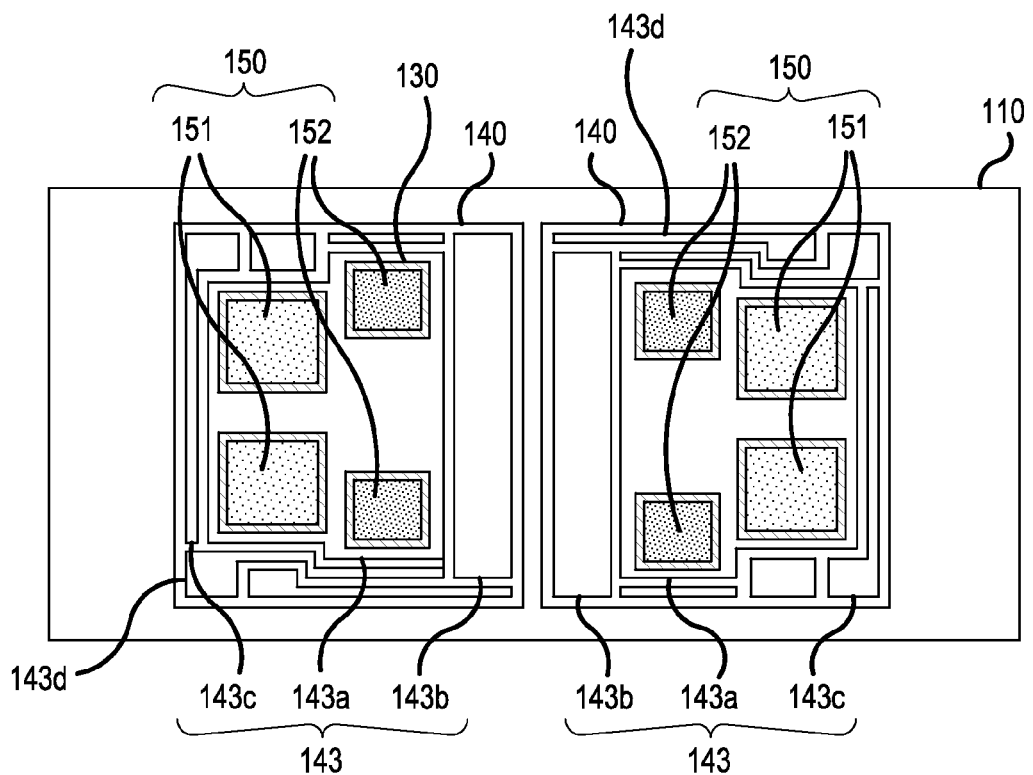
FIGS. 2A and 2B are diagrams showing one example of a condition in which DCB substrates and chips are disposed on a heat dissipation base.
Figure 2B:
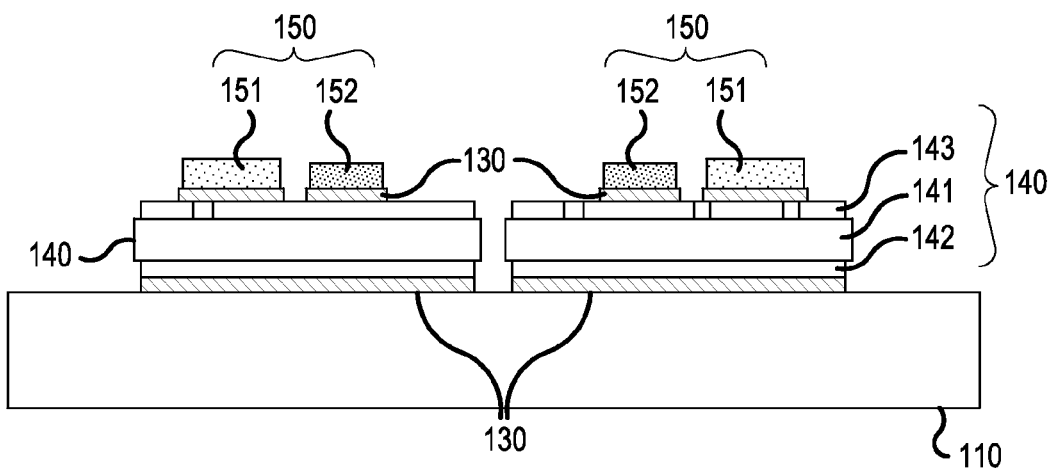

FIG. 2 is a diagram showing one example of a condition in which the DCB substrates and chips are disposed on the heat dissipation base. (A) of FIG. 2 is a schematic plan view, and (B) of FIG. 2 is a schematic side view.

Two DCB substrates 140 are joined, one via each solder layer 130, to the top of heat dissipation base 110 of circuit assembly 100 included in semiconductor module 1, and various types of chips 150 are mounted on each of the two DCB substrates 140, one via each solder layer 130.

A metal material such as copper (Cu) is used for heat dissipation base 110. Solder such as lead-free solder is used for the solder layers 130.

Each of DCB substrates 140 has an insulating substrate 141 and conductor patterns 142 and 143 provided on either surface of the insulating substrate 141, as shown in (A) and (B) of FIG. 2. A material, such as alumina (aluminium oxide) or aluminium nitride, exhibiting a predetermined withstand voltage, heat conductance, and heat expansion coefficient is used for the insulating substrate 141. A metal material such as Cu is used for the conductor patterns 142 and 143. Of the conductor patters 142 and 143, the conductor pattern 142 on heat dissipation base 110 side is formed as, for example, a so-called solid pattern, while the conductor pattern 143 on the chip 150 side is formed as a pattern of a predetermined shape for configuring a circuit with chips 150, wires (boding wires) to be described hereafter, and the like.

The two independent DCB substrates 140 having this kind of configuration, each with the conductor pattern 142 side on heat dissipation base 110 side, are joined, one via each solder layer 130, to the top of heat dissipation base 110. Heat generated on the DCB substrate 140 side (in chips 150 when operating) is transferred to heat dissipation base 110 via the conductor patterns 142 and the solder layers 130 therebelow, and the transferred heat is dissipated to the exterior from heat dissipation base 110.

As chips 150, a pair of insulated gate bipolar transistors (IGBTs) 151 and a pair of free wheeling diodes (FWDs) 152 are mounted on each of the two DCB substrates 140. These kinds of pair of IGBTs 151 and pair of FWDs 152 are joined, one via each solder layer 130, to their respective predetermined positions on the conductor patterns 143 of each DCB substrate 140.

When the IGBTs 151 and FWDs 152 are mounted as chips 150, for example, kinds of first, second, and third main conductor patterns 143a, 143b, and 143c shown in (A) of FIG. 2 are formed on each DCB substrate 140 as the conductor patterns 143 thereof.

Herein, collector electrodes provided on the rear surfaces (lower surfaces) of the IGBTs 151 and cathode electrodes provided on the rear surfaces (lower surfaces) of the FWDs 152 are joined, one via each solder layer 130, to their respective predetermined regions of the first main conductor pattern 143a. Emitter electrodes provided on the front surfaces (upper surfaces) of the IGBTs 151 and anode electrodes provided on the front surfaces (upper surfaces) of the FWDs 152 are connected to the second main conductor pattern 143b via wires, as described hereafter. Gate electrodes provided on the front surfaces (upper surfaces) of the IGBTs 151 are connected to the third conductor pattern 143c via wires, as described hereafter. Also, an auxiliary conductor pattern 143d (a conductor pattern other than 143a to 143b) electrically connected via wires to the first, second, and third main conductor patterns 143a, 143b, and 143c is formed on each DCB substrate 140.

As the two DCB substrates 140 joined to the top of heat dissipation base 110, for example, DCB substrates of the same configuration are used. The two DCB substrates 140 of the same configuration are joined to the top of heat dissipation base 110 so as to be oriented so that one is rotated 180° relative to the other in plan view, as shown in (A) of FIG. 2.

In circuit assembly 100, the two DCB substrates 140 joined to the top of heat dissipation base 110, and chips 150 (IGBTs 151 and FWDs 152) joined to the top of each DCB substrate 140, in this way, are electrically connected via wires (wire bonding). Circuit assembly 100 is arranged so that circuits with different functions can be realized depending on the way of performing the wire bonding (wire bonding between the two DCB substrates 140).

Firstly, a description will be given of a first example of circuit assembly 100 and a configuration of semiconductor module 1 in this case.

Figure 3A:
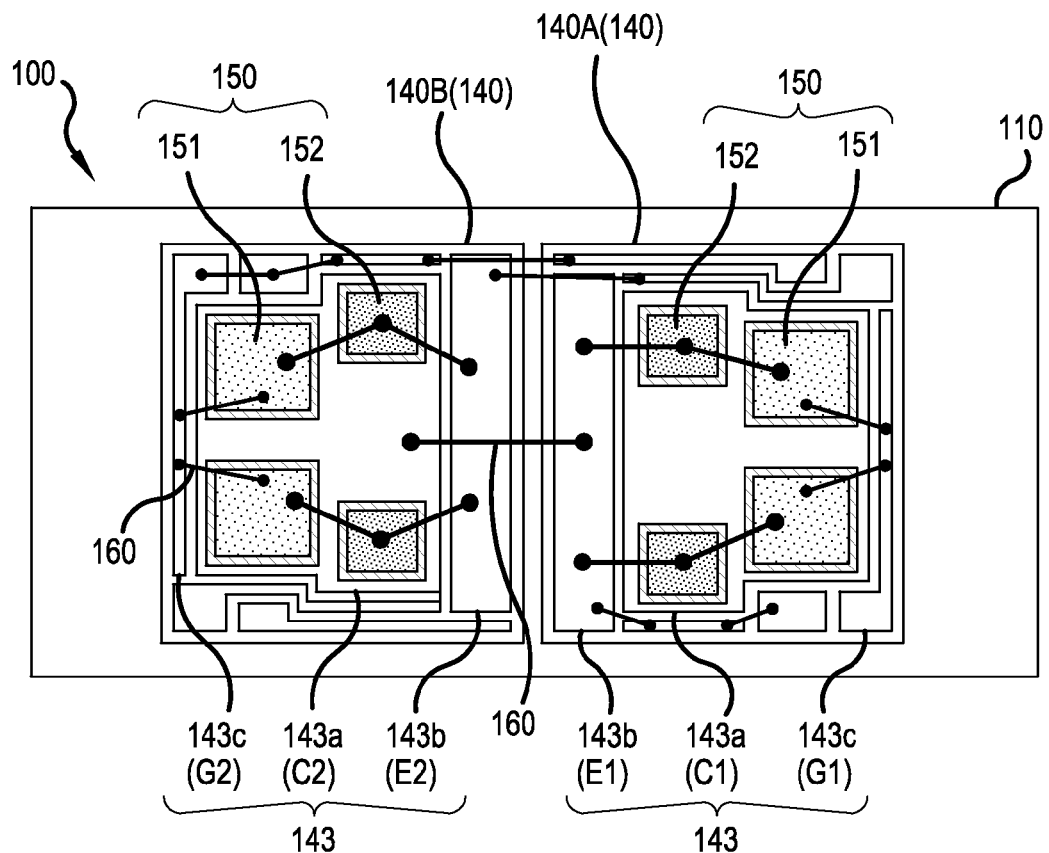
FIGS. 3A and 3B are diagrams showing one example of a condition in which wire bonding is performed.
Figure 3B:
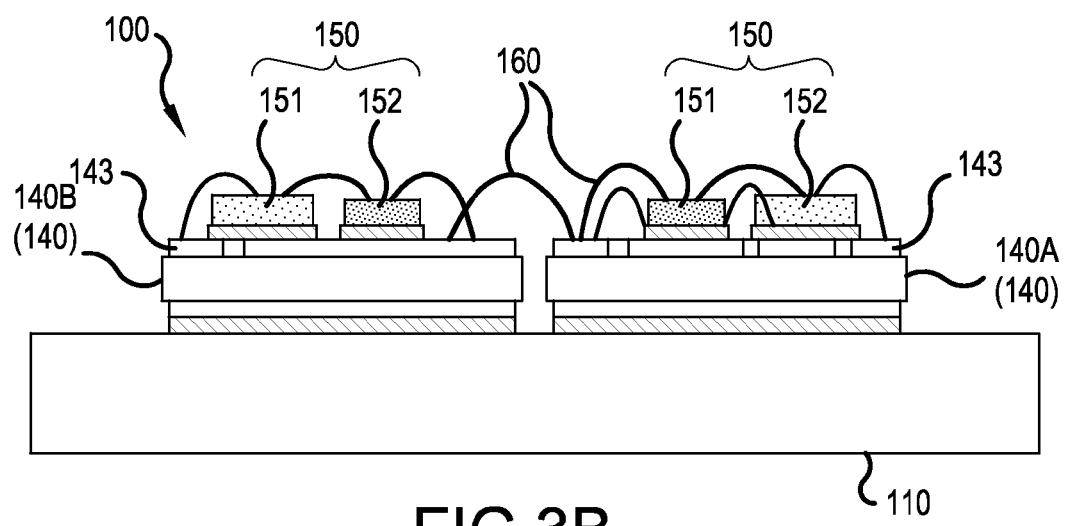
Figure 4:
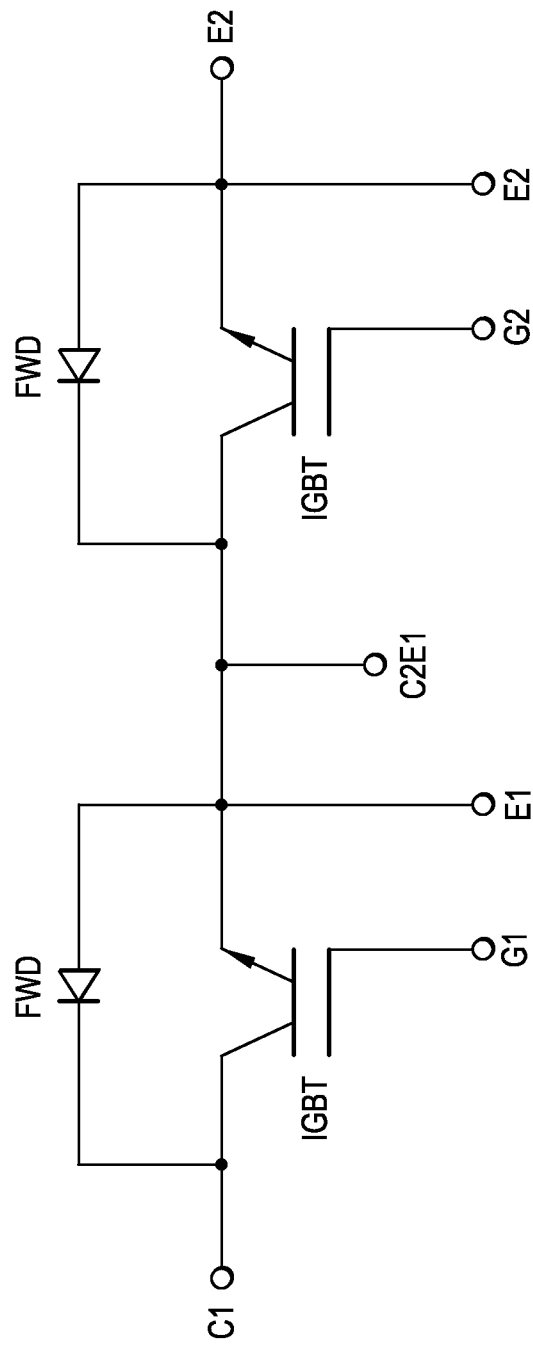
FIG. 4 is an equivalent circuit diagram (1) after the wire bonding.

FIG. 3 is a diagram showing one example of a condition in which the wire bonding is performed. (A) of FIG. 3 is a schematic plan view, and (B) of FIG. 3 is a schematic side view. Also, FIG. 4 is an equivalent circuit diagram after the wire bonding.

In (A) of FIG. 3, one element and another are connected by one wire for the sake of simplicity, but one element and another may be connected by a plurality of wires. Also, in (A) and (B) of FIG. 3, in places connected by a plurality of wires, the plurality of wires are illustrated in thick lines for the sake of simplicity.

The collector electrodes of the IGBTs 151 and cathode electrodes of the FWDs 152 on each DCB substrate 140 are joined, one via each solder layer 130, to the first main conductor pattern 143a. The emitter electrodes of the IGBTs 151 are connected to the anode electrodes of the FWDs 152 by wires 160 of aluminium (Al) or the like, and the anode electrodes of the FWDs 152 are connected to the second main conductor pattern 143b by wires 160. The gate electrodes of the IGBTs 151 are connected to the third main conductor pattern 143c by wires 160. The first main conductor patterns 143a form collector (C) terminals of circuit assembly 100, the second main conductor patterns 143b form emitter (E) terminals of circuit assembly 100, and the third main conductor patterns 143c form gate (G) terminals of circuit assembly 100.

The conductor patterns 143 and chips 150 on each of the two DCB substrates 140 on heat dissipation base 110 are all connected by wire bonding in this way. Herein, for the sake of simplicity, the first main conductor pattern 143a, second main conductor pattern 143b, and third main conductor pattern 143c of one DCB substrate 140 (a first DCB substrate 140A) are taken to be a C1 terminal, an E1 terminal, and a G1 terminal respectively, while the first main conductor pattern 143a, second main conductor pattern 143b, and third main conductor pattern 143c of the other DCB substrate 140 (a second DCB substrate 140B) are taken to be a C2 terminal, an E2 terminal, and a G2 terminal respectively.

Meanwhile, the wire bonding between first DCB substrate 140A and second DCB substrate 140B on heat dissipation base 110 is carried out in the following way in this example of FIG. 3. That is, the second main conductor pattern 143b (E1 terminal) of the one first DCB substrate 140A and the first main conductor pattern 143a (C2 terminal) of the other second DCB substrate 140B are connected by the wire 160 (the wire 160 illustrated in thick line) (C2E1 terminal).

In circuit assembly 100, the kind of circuit shown in FIG. 4 is configured by this kind of wire bonding. That is, a circuit element wherein the IGBTs and FWDs are connected in parallel is configured on each of first DCB substrate 140A and second DCB substrate 140B, and a circuit wherein these kinds of circuit elements, one on each of first DCB substrate 140A and second DCB substrate 140B, are connected in series is configured on heat dissipation base 110. In FIG. 4, the circuit element configured on first DCB substrate 140A is shown using one IGBT and one FWD, and the circuit element configured on second DCB substrate 140B is shown using one IGBT and one FWD, for simplicity of description of the circuit configurations.

In semiconductor module 1, predetermined electrode terminals 120 are mounted in predetermined terminal positions on circuit assembly 100 wherein the kind of series-connected circuit in this first example is configured.

Figure 5A:
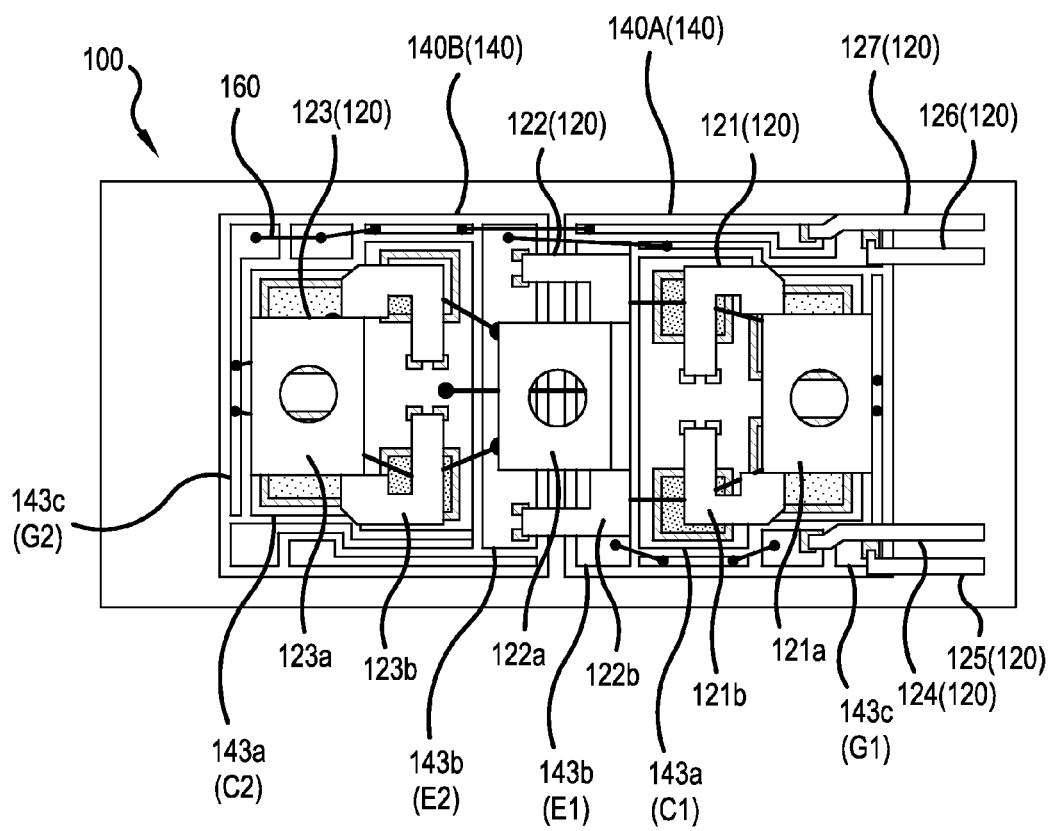
FIGS. 5A and 5B are diagrams showing one example of a condition in which electrode terminals are mounted.
Figure 5B:
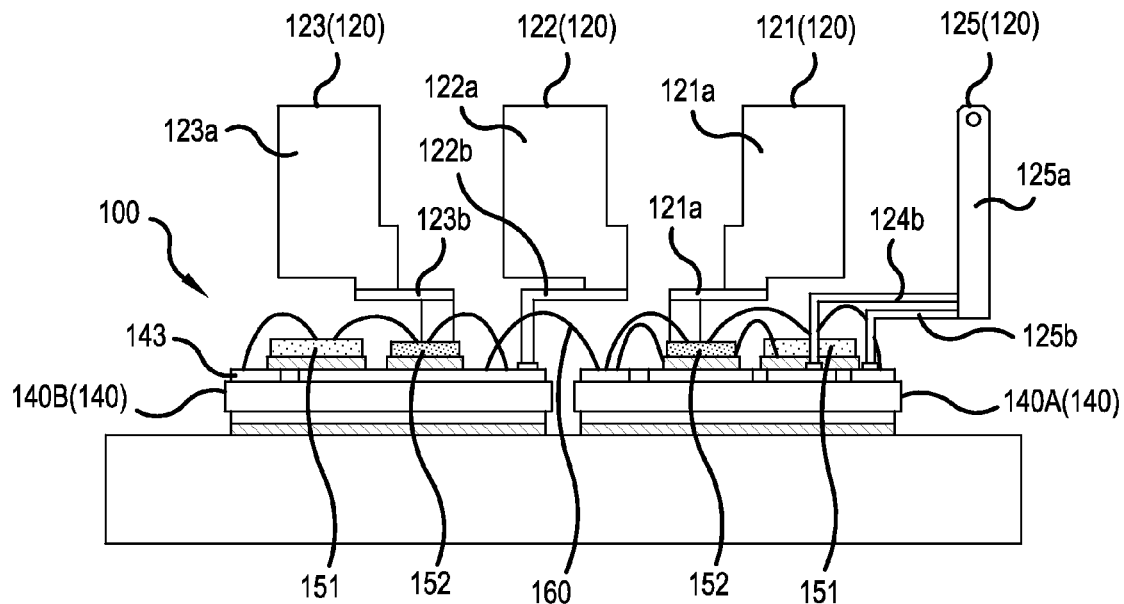

FIG. 5 is a diagram showing one example of a condition in which the electrode terminals are mounted. Herein, (A) of FIG. 5 is a schematic plan view, and (B) of FIG. 5 is a schematic side view. In (A) and (B) of FIG. 5, in places connected in parallel by a plurality of wires too, the plurality of wires are represented in thin lines the same as those in the other connected places, rather than in thick lines.

In the case of circuit assembly 100 in which is configured the kind of series-connected circuit in the first example, as the electrode terminals 120, three main electrode terminals 121, 122, and 123 and four auxiliary electrode terminals 124, 125, 126, and 127 are connected to the series-connected circuit. The main electrode terminals 121 to 123 and auxiliary electrode terminals 124 to 127 are formed in advance using a metal material, such as Al or Cu, before being mounted on circuit assembly 100.

The main electrode terminal 121 is connected to the C1 terminal (first main conductor pattern 143a) of first DCB substrate 140A. The main electrode terminal 121 has a terminal main body portion 121a and two leg portions 121b leading out of the terminal main body portion 121a. The two leg portions 121b of the main electrode terminal 121 are mounted on the first main conductor pattern 143a of first DCB substrate 140A by soldering or the like. The reason the two leg portions 121b are provided in the main electrode terminal 121 and connected to the top of the first main conductor pattern 143a of first DCB substrate 140A in this way is to prevent electrical bias (imbalance in resistance or impedance) from occurring between one set of IGBT 151 and FWD 152, and the other set of IGBT 151 and FWD 152, on first DCB substrate 140A.

Main electrode terminal 122 is connected to the E2 terminal (second main conductor pattern 143b) of second DCB substrate 140B. Main electrode terminal 122 has a terminal main body portion 122a and two leg portions 122b leading out of the terminal main body portion 122a. The two leg portions 122b of main electrode terminal 122 are mounted on the second main conductor pattern 143b of second DCB substrate 140B by soldering or the like. The reason the connection of main electrode terminal 122 is carried out in two places in this way is to prevent electrical bias from occurring between one set of IGBT 151 and FWD 152, and the other set of IGBT 151 and FWD 152, on second DCB substrate 140B.

Main electrode terminal 123 is connected to the C2 terminal (first main conductor pattern 143a) of second DCB substrate 140B connected to the E1 terminal (second main conductor pattern 143b) of first DCB substrate 140A by the wire 160. Main electrode terminal 123 has a terminal main body portion 123a and two leg portions 123b leading out of the terminal main body portion 123a. The two leg portions 123b of main electrode terminal 123 are mounted on the first main conductor pattern 143a of second DCB substrate 140B by soldering or the like. The reason the connection of main electrode terminal 123 is carried out in two places in this way is to prevent electrical bias from occurring between one set of IGBT 151 and FWD 152, and the other set of IGBT 151 and FWD 152, on second DCB substrate 140B.

The terminal main body portions 121*a* to 123*a* of the main electrode terminals 121 to 123 are formed in a substantially U-shape with respective leg portion 121*b* to 123*b* sides in an opening direction.

Also, the auxiliary electrode terminal 124 has a terminal main body portion 124*a* and a leg portion 124*b*. The leg portion 124*b* of the auxiliary electrode terminal 124 is mounted by soldering, or the like, on the auxiliary conductor pattern 143*d* electrically connected via the wire 160 to the E1 terminal (second main conductor pattern 143*b*) of first DCB substrate 140A.

The auxiliary electrode terminal 125 has a terminal main body portion 125*a* and a leg portion 125*b*. The leg portion 125*b* of the auxiliary electrode terminal 125 is mounted on the G1 terminal (third main conductor pattern 143*c*) of first DCB substrate 140A by soldering or the like.

The auxiliary electrode terminal 126 has a terminal main body portion 126*a* and a leg portion 126*b*. The leg portion 126*b* of the auxiliary electrode terminal 126 is mounted by soldering, or the like, on the auxiliary conductor pattern 143*d* of first DCB substrate 140A to which the E2 terminal (second main conductor pattern 143*b*) of second DCB substrate 140B is electrically connected via the wire 160.

The auxiliary electrode terminal 127 has a terminal main body portion 127*a* and a leg portion 127*b*. The leg portion 127*b* of the auxiliary electrode terminal 127 is mounted by soldering, or the like, on the auxiliary conductor pattern 143*d* of first DCB substrate 140A to which the G2 terminal (third main conductor pattern 143*c*) of second DCB substrate 140B is electrically connected via the wire 160.

The main electrode terminals 121 to 123 and auxiliary electrode terminals 124 to 127 are formed in advance in a shape such that their respective terminal main body portions 121*a* to 127*a* are disposed in predetermined positions on circuit assembly 100 in a condition in which the leg portions 121*b* to 127*b* are mounted in predetermined places. The main electrode terminals 121 to 123 and auxiliary electrode terminals 124 to 127 are formed in advance, for example, so that the terminal main body portions 121*a* to 123*a* of the main electrode terminals 121 to 123 are disposed in parallel at substantially equal intervals in the central portion of circuit assembly 100, and the terminal main body portions 124*a* to 127*a* of the auxiliary electrode terminals 124 to 127 are disposed in parallel in the end portion of circuit assembly 100, as shown in FIG. 5.

In semiconductor module 1 including circuit assembly 100 wherein the series-connected circuit is configured, as in the first example, circuit assembly 100 on which the main electrode terminals 121 to 123 and auxiliary electrode terminals 124 to 127 are mounted in this way is covered with exterior case 200.

Figure 6A:
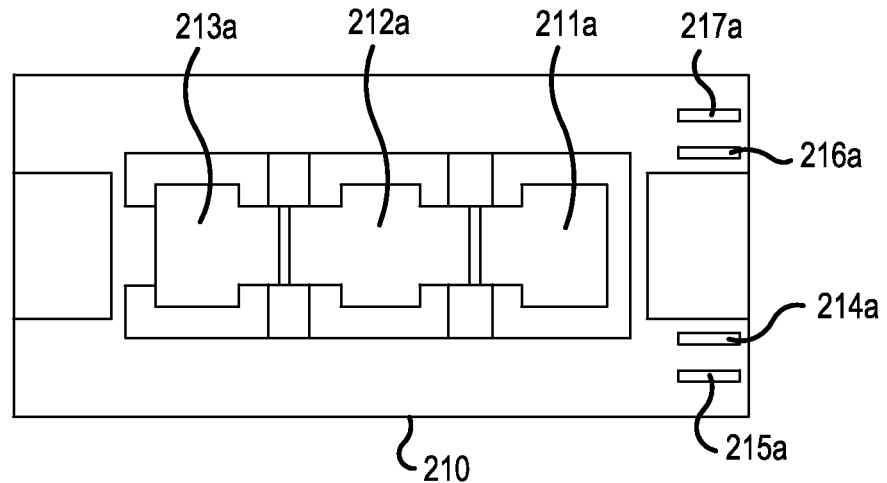
FIGS. 6A, 6B and 6C are diagrams showing one example of an exterior case.
Figure 6B:
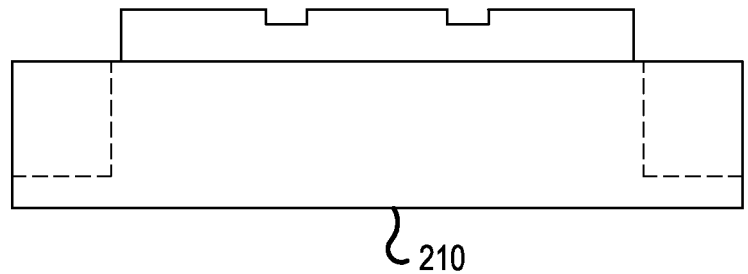
Figure 6C:
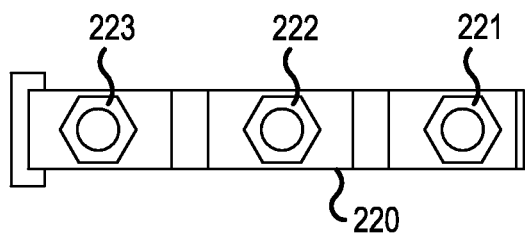

FIG. 6 is a diagram showing one example of the exterior case. (A) of FIG. 6 is a schematic plan view of a case main body portion, (B) of FIG. 6 is a schematic side view of the case main body portion, and (C) of FIG. 6 is a schematic plan view of a case insertion member.

Exterior case 200 includes a case main body portion 210 such as shown in (A) and (B) of FIG. 6 and a case insertion member 220, such as shown in (C) of FIG. 6, which is inserted into a predetermined space inside case main body portion 210. Case main body portion 210 and case insertion member 220 of exterior case 200 are formed using, for example, a resin material and utilizing a method such as resin molding. Case main body portion 210 is formed as a single member by, for example, resin integral molding.

Exterior case 200 is configured separately from the main electrode terminals 121 to 123 and auxiliary electrode terminals 124 to 127. Kinds of opening portions 211*a* to 217*a* through which their respective terminal main body portions 121*a* to 127*a* are inserted, and the respective upper end portions of the terminal main body portions 121*a* to 127*a* are exposed to the exterior, when circuit assembly 100 wherein the main electrode terminals 121 to 123 and auxiliary electrode terminals 124 to 127 are mounted in the predetermined terminal positions in the way heretofore described is covered with case main body portion 210, are provided in case main body portion 210. An insertion space arranged so that case insertion member 220 can be inserted thereinto in a direction (a rightward direction in FIG. 6) in which the opening portions 211*a* to 213*a* are disposed in parallel is provided below the opening portions 211*a* to 213*a* of this kind of case main body portion 210 through which the main electrode terminals 121 to 123 are inserted.

Nuts 221 to 223 are provided one in each of positions on case insertion member 220 corresponding to the opening portions 211*a* to 213*a* through which are inserted the main electrode terminals 121 to 123 of case main body portion 210. The nuts 221 to 223 are screwed to a compact from the rear and mounted on case insertion member 220. After circuit assembly 100 has been covered with case main body portion 210, this kind of case insertion member 220 is inserted into the predetermined insertion space of case main body portion 210 in a direction in which the main electrode terminals 121 to 123 are disposed in parallel.

The terminal main body portions 121*a* to 123*a* of the main electrode terminals 121 to 123 are formed in a substantially U-shape so that this kind of case insertion member 220 can be inserted thereinto, and case insertion member 220 is inserted inside these kinds of substantially U-shaped terminal main body portions 121*a* to 123*a*.

Figure 7A:
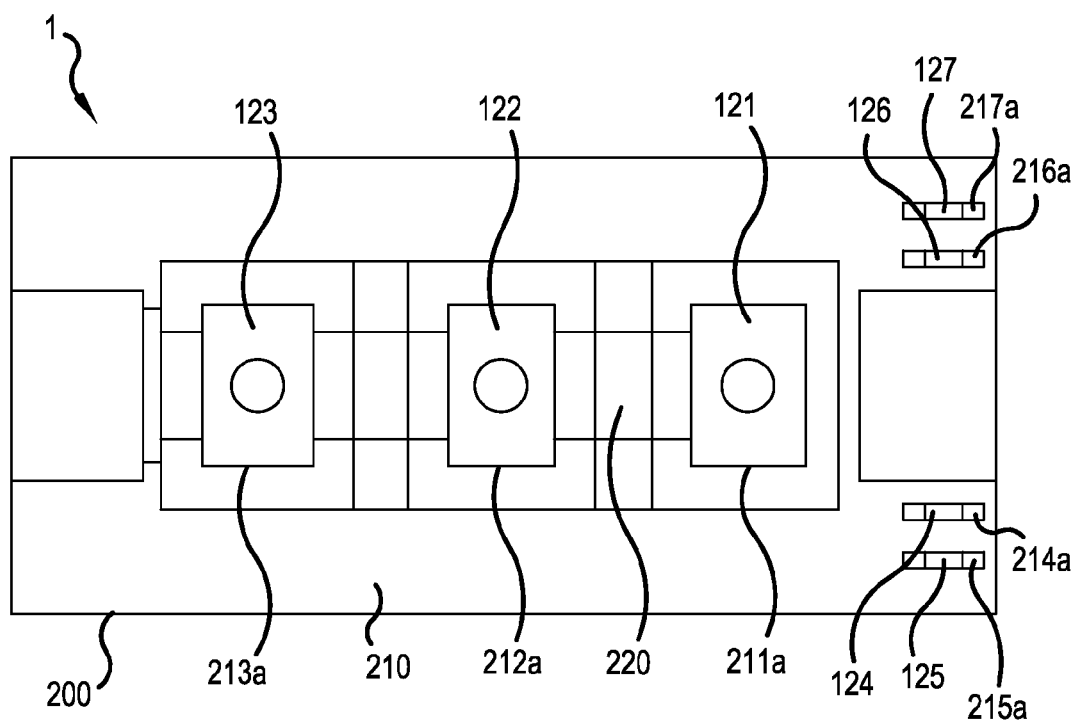
FIGS. 7A and 7B are diagrams showing one example of a condition in which the exterior case is mounted.
Figure 7B:
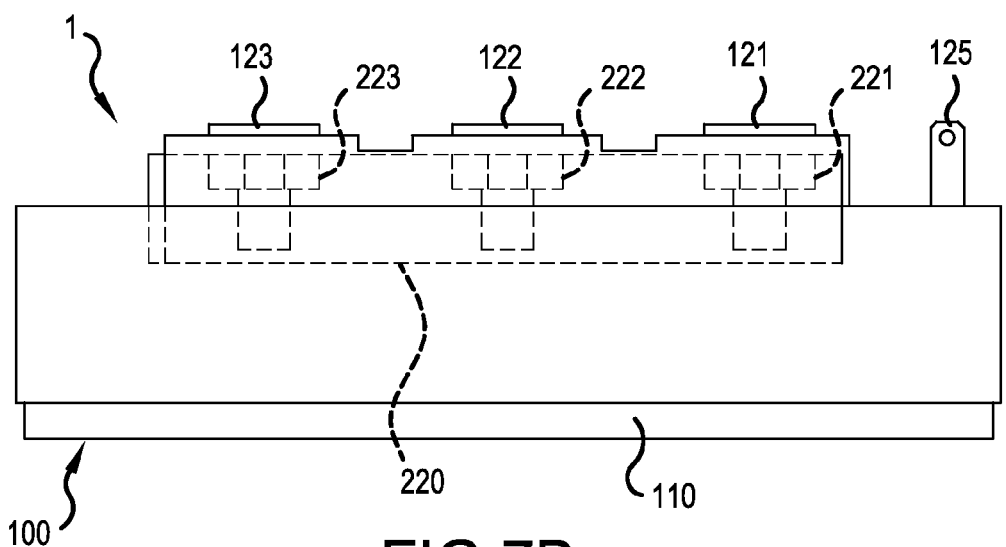

FIG. 7 is a diagram showing one example of a condition in which the exterior case is mounted. (A) of FIG. 7 is a schematic plan view, and (B) of FIG. 7 is a schematic side view.

Circuit assembly 100 on which are mounted the main electrode terminals 121 to 123 and auxiliary electrode terminals 124 to 127 is covered with the heretofore described kind of case main body portion 210 of exterior case 200. The upper end portions of the main electrode terminals 121 to 123 are exposed from their respective opening portions 211*a* to 213*a* of case main body portion 210 with which circuit assembly 100 is covered, and the upper end portions of the auxiliary electrode terminals 124 to 127 are exposed from their respective opening portions 214*a* to 217*a*. The exposed upper end portions form the external connection terminals of semiconductor module 1.

Case main body portion 210 with which circuit assembly 100 is covered is fixed to circuit assembly 100 by bonding the lower end portion of case main body portion 210 to heat dissipation base 110 of circuit assembly 100 by an adhesive, or the like. Further, case insertion member 220 is inserted into and fixed to case main body portion 210 covering and fixed to circuit assembly 100.

Case insertion member 220 is inserted into case main body portion 210 so as to be inserted inside the substantially U-shaped terminal main body portions 121*a* to 123*a* of the main electrode terminals 121 to 123 in a direction in which the terminal main body portions 121*a* to 123*a* are disposed in parallel. The nuts 221 to 223 of case insertion member 220 are disposed below the upper end portions of the main electrode terminals 121 to 123 exposed from case main body portion 210, as shown in (B) of FIG. 7.

It is preferable to seal chips 150, DCB substrates 140, and wires 160 of circuit assembly 100 with a sealing resin after the mounting of case main body portion 210 on circuit assembly 100, and before the insertion of case insertion member 220 (which may also be after the insertion of case insertion member 220 if possible).

Semiconductor module 1 is firstly arranged to be able to include circuit assembly 100 having the kind of configuration described as the above first example. Semiconductor module 1 is a so-called 2-in-1 module wherein first DCB substrate 140A and second DCB substrate 140B on each of which are mounted the IGBTs 151 and FWDs 152 are connected in series.

The assembly of semiconductor module 1 including the kind of circuit assembly 100 in the first example is carried out in the kind of procedure shown in FIGS. 2, 3, 5, and 7. That is, firstly, DCB substrates 140 and chips 150 are disposed on heat dissipation base 110 (chips 150 are disposed after DCB substrates 140 have been disposed on heat dissipation base 110, or DCB substrates 140 on each of which chips 150 are disposed are disposed on heat dissipation base 110), as in FIG. 2. Further, wire bonding is carried out as in FIG. 3, the electrode terminals 120 are mounted as in FIG. 5, and exterior case 200 is mounted as in FIG. 7. By so doing, it is possible to obtain semiconductor module 1 (2-in-1 module) including circuit assembly 100 having the series-connected circuit.

Semiconductor module 1 is arranged so that depending on the way of wire bonding circuit assembly 100 thereof, it is possible to realize a circuit with a function different from that of the first example. Subsequently, a description will be given of a second example of circuit assembly 100 and a configuration of semiconductor module 1 in this case.

Figure 8A:
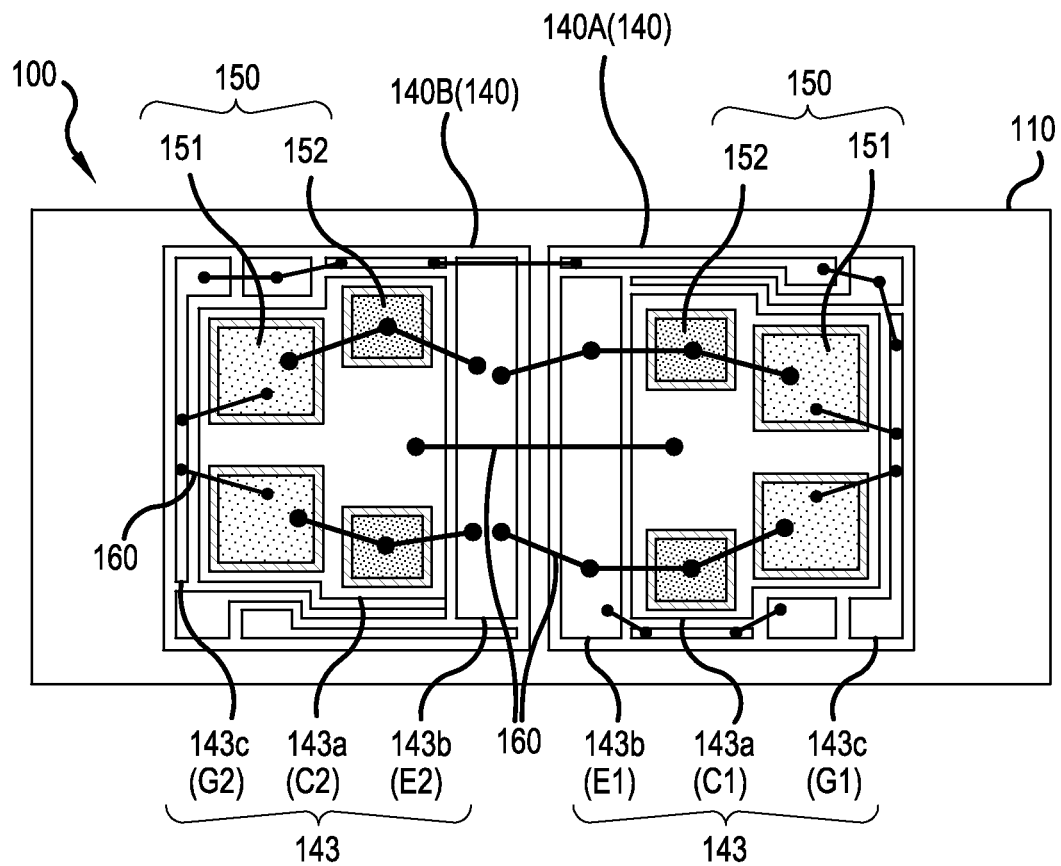
FIGS. 8A and 8B are diagrams showing one example of a condition in which wire bonding is performed.
Figure 8B:
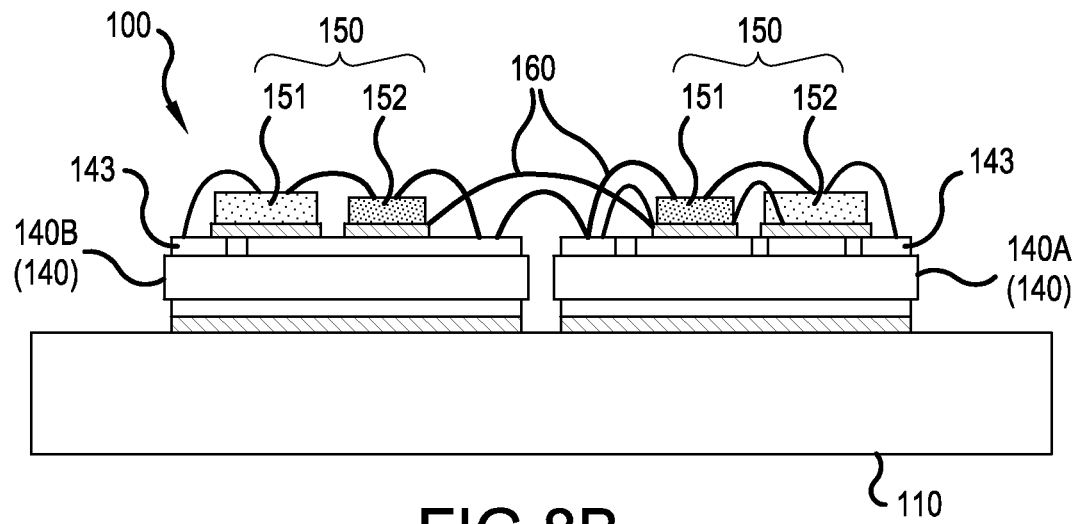
Figure 9:
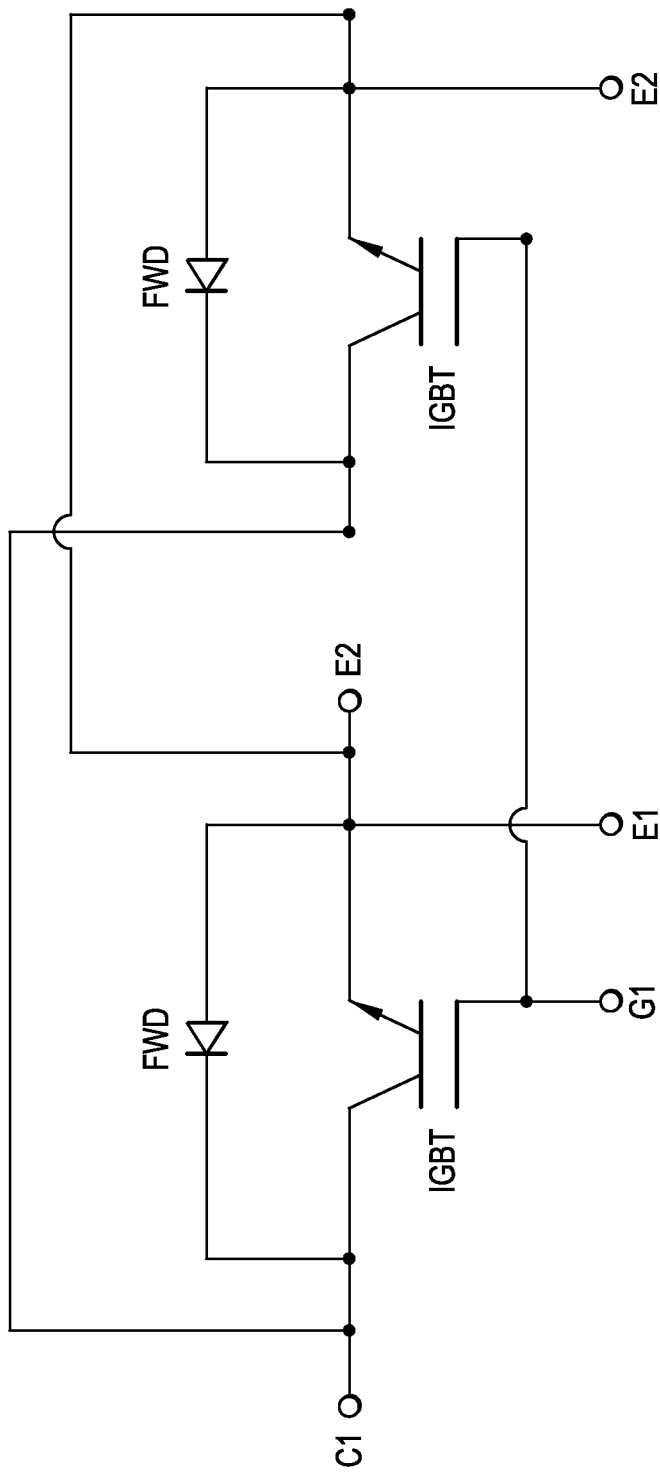
FIG. 9 is a substantial circuit diagram after the wire bonding.
Figure 10:
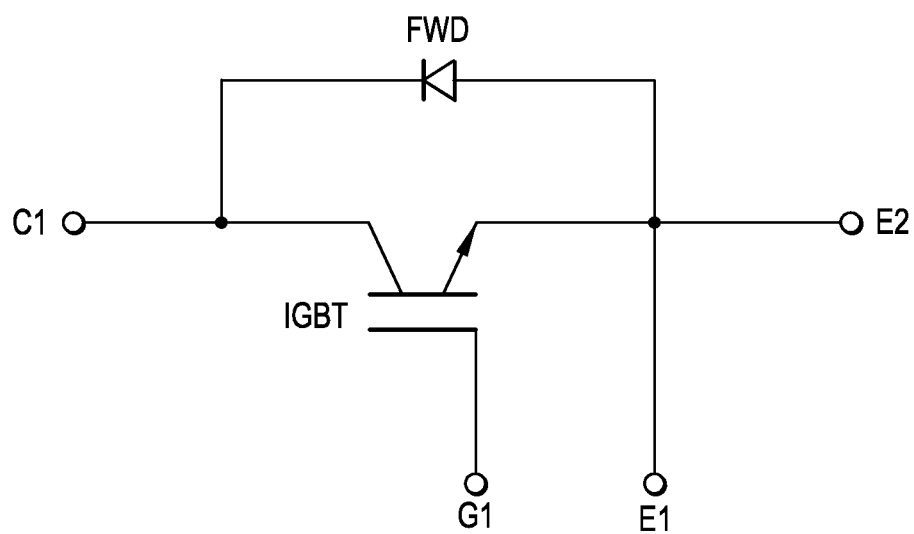
FIG. 10 is an equivalent circuit diagram (2) after the wire bonding.

FIG. 8 is a diagram showing one example of a condition in which circuit assembly 100 is wire bonded. (A) of FIG. 8 is a schematic plan view, and (B) of FIG. 8 is a schematic side view. FIG. 9 is a substantial circuit diagram after the wire bonding. FIG. 10 is an equivalent circuit diagram after the wire bonding.

In (A) of FIG. 8, one element and another are connected by one wire for the sake of simplicity, but one element and another may be connected by a plurality of wires. Also, in (A) and (B) of FIG. 8, in places connected by a plurality of wires, the plurality of wires are illustrated in thick lines for the sake of simplicity.

In FIG. 8 too, in the same way as in FIGS. 2 and 3, chips 150 (IGBTs 151 and FWDs 152) are joined, one via each solder layer 130, to their respective predetermined positions on each of two DCB substrates 140 (first DCB substrate 140A and second DCB substrate 140B) on heat dissipation base 110.

The connection between the conductor patterns 143 (first, second, and third main conductor patterns 143a, 143b, and 143c) and chips 150 on each of first DCB substrate 140A and second DCB substrate 140B by wires 160 is carried out in the same way as in FIG. 3.

That is, the collector electrodes of the IGBTs 151 and the cathode electrodes of the FWDs 152 on first DCB substrate 140A are joined, one via each solder layer 130, to the first main conductor pattern 143a. The emitter electrodes of the IGBTs 151 are connected one each to the anode electrodes of the FWDs 152 by wires 160, and the anode electrodes of the FWDs 152 are connected to the second main conductor pattern 143b by wires 160. The gate electrodes of the IGBTs 151 are connected to the third main conductor pattern 143c by wires 160. The connection on the second DCB substrate 140 is carried out in the same way. The first main conductor pattern 143a of first DCB substrate 140A is the C1 terminal, the second main conductor pattern 143b is the E1 terminal, and the third main conductor pattern 143c is the 01 terminal. The first main conductor pattern 143a of second DCB substrate 140B is the C2 terminal, the second main conductor pattern 143b is the E2 terminal, and the third main conductor pattern 143c is the G2 terminal.

Meanwhile, the connections by wires 160 between first DCB substrate 140A and second DCB substrate 140B are carried out in the following way in the example of FIG. 8. That is, the first main conductor pattern 143a (C1 terminal) of first DCB substrate 140A and the first main conductor pattern 143a (C2 terminal) of second DCB substrate 140B are connected by the wire 160 (the wire 160 illustrated in the thick line). Furthermore, the second main conductor pattern 143b (E1 terminal) of first DCB substrate 140A and the second main conductor pattern 143b (E2 terminal) of second DCB substrate 140B are connected by wires 160 (wires 160 illustrated in the thick lines).

In circuit assembly 100, the kind of circuit shown in FIG. 10 is configured by this kind of wire bonding. That is, a circuit element wherein the IGBTs and FWDs are connected in parallel is configured on each of first DCB substrate 140A and second DCB substrate 140B, and a circuit wherein these kinds of circuit elements are connected in parallel on first DCB substrate 140A and second DCB substrate 140B is configured on heat dissipation base 110. In FIG. 10, the circuit element configured on first DCB substrate 140A is shown by one IGBT and one FWD, and the circuit element configured on second DCB substrate 140B is shown by one IGBT and one FWD, for simplification of description of the circuit configurations. FIG. 9 shows a configuration wherein the IGBT and FWD are connected in parallel.

In this way, in circuit assembly 100 of the second example, a circuit different from that in the first example is configured by changing the connections by wires 160 between DCB substrates 140 without changing the connections by wires 160 between DCB substrates 140, between chips 150 mounted on each of DCB substrates 140, and between DCB substrates 140 and chips 150.

In semiconductor module 1, predetermined electrode terminals 120 are mounted in predetermined terminal positions on circuit assembly 100 wherein the kind of parallel-connected circuit in the second example is configured.

Figure 11A:
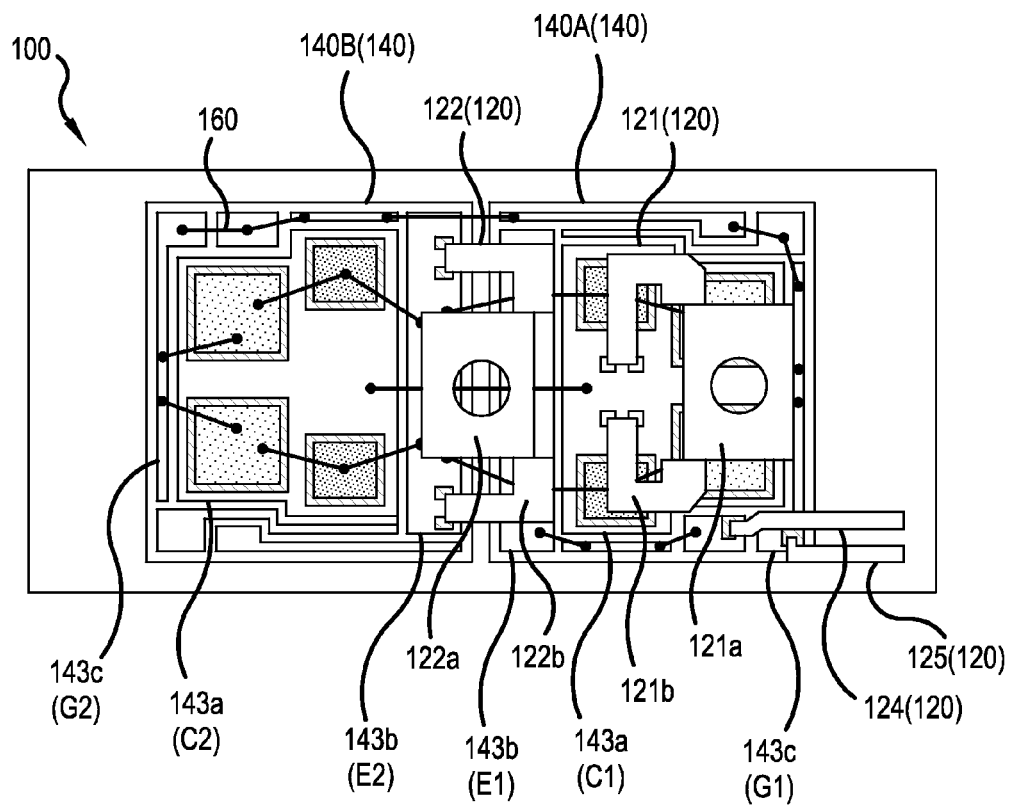
FIGS. 11A and 11B are diagrams showing one example of a condition in which electrode terminals are mounted.
Figure 11B:
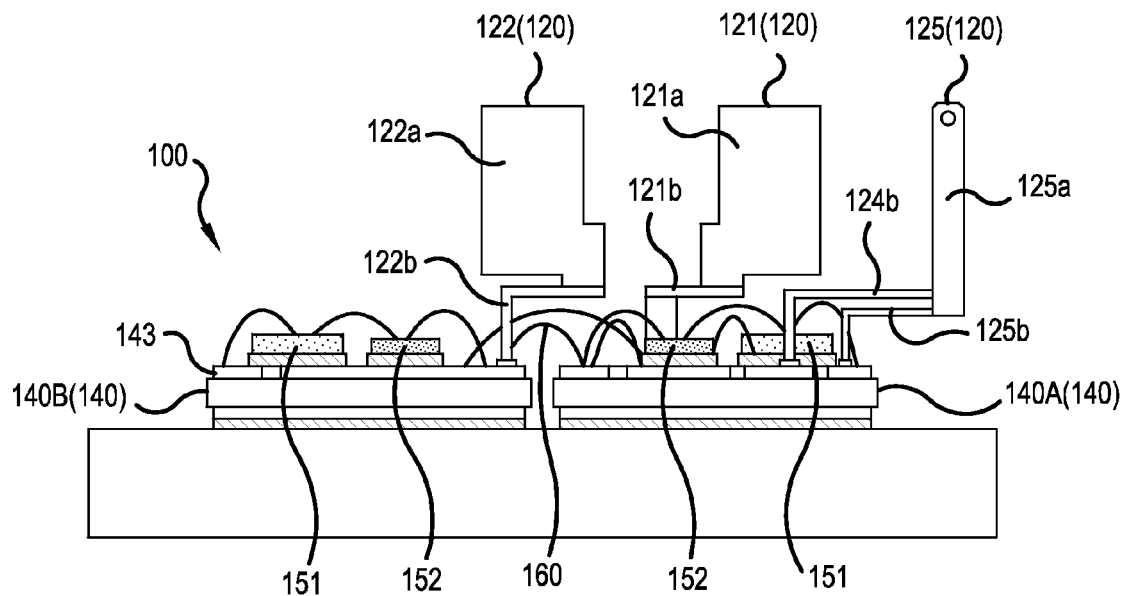

FIG. 11 is a diagram showing one example of a condition in which the electrode terminals are mounted. Herein, FIG. 11(A) is a schematic plan view, and FIG. 11(B) is a schematic side view. In FIG. 11(A) and FIG. 11(B), in places connected in parallel by a plurality of wires too, the plurality of wires are represented in thin lines the same as those in the other connected places, rather than in thick lines.

In the case of circuit assembly 100 wherein the kind of parallel-connected circuit in the second example is configured, two main electrode terminals 121 and 122 and two auxiliary electrode terminals 124 and 125 are connected, as the electrode terminals 120, to the parallel-connected circuit. Main electrode terminals 121 and 122 and auxiliary electrode terminals 124 and 125 used in circuit assembly 100 of the second example are the same as those used in the first example.

Leg portions 121b leading out of terminal main body portion 121a of main electrode terminal 121 are mounted on the C1 terminal (first main conductor pattern 143a) of first DCB substrate 140A by soldering or the like. The C2 terminal (first main conductor pattern 143a) of second DCB substrate 140B is connected to the C1 terminal of first DCB substrate 140A by the wire 160, as heretofore described.

Leg portions 122b leading out of terminal main body portion 122a of main electrode terminal 122 are mounted on the E2 terminal (second main conductor pattern 143b) of second DCB substrate 140B by soldering or the like. The E1 terminal (second main conductor pattern 143b) of first DCB substrate 140A is connected to the E2 terminal of second DCB substrate 140B by wires 160, as heretofore described.

Also, leg portion 124b leading out of terminal main body portion 124a of auxiliary electrode terminal 124 is mounted by soldering, or the like, on auxiliary conductor pattern 143d electrically connected via wires 160 to the E1 terminal (second main conductor pattern 143b) of first DCB substrate 140A.

Leg portion 125b leading out of terminal main body portion 125a of auxiliary electrode terminal 125 is mounted by soldering, or the like, on the 01 terminal (third main conductor pattern 143c) of first DCB substrate 140A to which the G2 terminal (third main conductor pattern 143c) of second DCB substrate 140B is electrically connected via wires 160.

In the case in which the parallel-connected circuit is adopted as in circuit assembly 100 of the second example, there is no more need for main electrode terminal 123 or auxiliary electrode terminals 126 and 127 mounted in the case in which the series-connected circuit is adopted as in the first example. Main electrode terminals 121 and 122 and auxiliary electrode terminals 124 and 125 mounted in circuit assembly 100 of the second example are such that their respective mounting positions (terminal positions) are terminal positions the same as those in the first example, and it is possible to use electrode terminals the same as those used in the first example.

In semiconductor module 1 including circuit assembly 100 wherein the parallel-connected circuit is configured as in the second example, circuit assembly 100 on which main electrode terminals 121 and 122 and auxiliary electrode terminals 124 and 125 are mounted in this way is covered with exterior case 200.

Figure 12A:
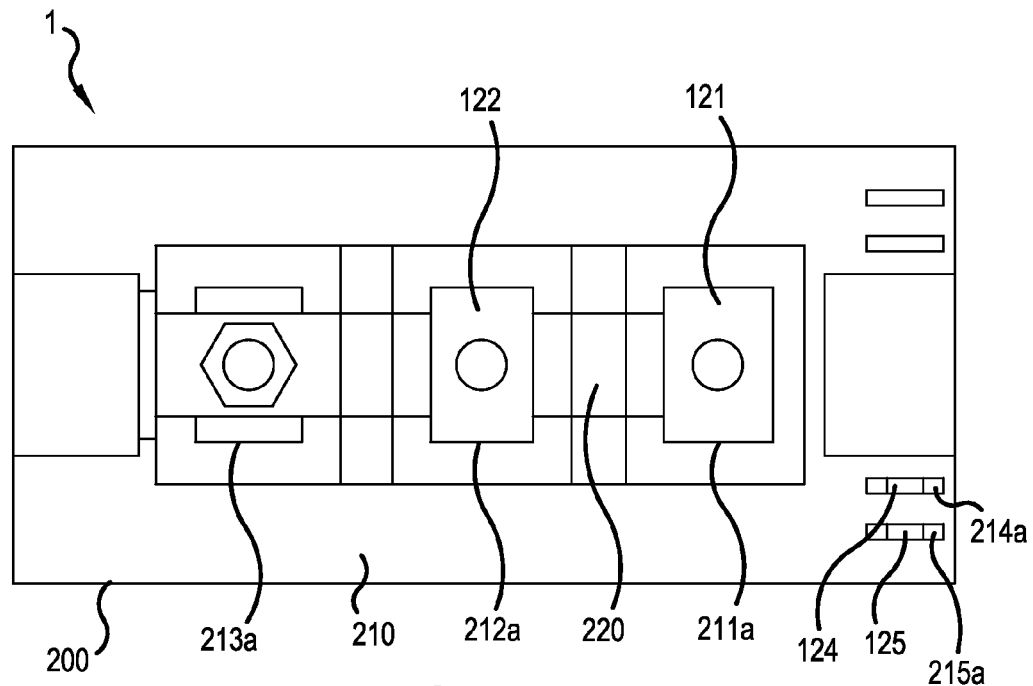
FIGS. 12A and 12B are diagrams showing one example of a condition in which an exterior case is mounted.
Figure 12B:
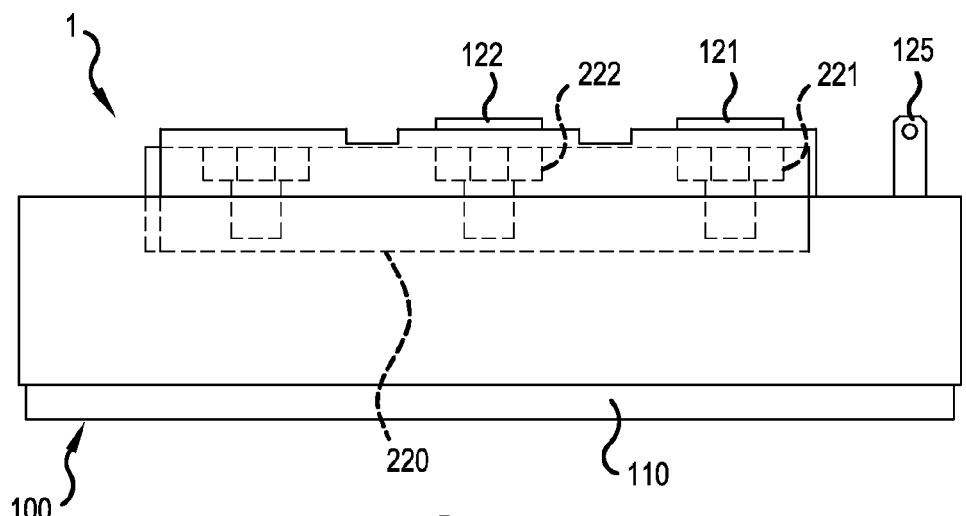

FIG. 12 is a diagram showing one example of a condition in which the exterior case is mounted. FIG. 12(A) is a schematic plan view, and FIG. 12(B) is a schematic side view.

Exterior case 200 the same as that shown in FIG. 6 is used. Circuit assembly 100 on which are mounted main electrode terminals 121 and 122 and auxiliary electrode terminals 124 and 125 is covered with case main body portion 210 of the kind of exterior case 200 shown in FIG. 6. The upper end portions of main electrode terminals 121 and 122 are exposed through their respective opening portions 211a and 212a of case main body portion 210, and the upper end portions of the auxiliary electrode terminals 124 and 125 are exposed through their respective opening portions 214a and 215a, from case main body portion 210 with which circuit assembly 100 is covered. The exposed upper end portions form the external connection terminals of semiconductor module 1.

Case main body portion 210 covering circuit assembly 100 is fixed to circuit assembly 100 by bonding the lower end portion of case main body portion 210 to heat dissipation base 110 of circuit assembly 100, or the like. Further, case insertion member 220 is inserted into and fixed to case main body portion 210 covering and fixed to circuit assembly 100. Case insertion member 220 is inserted and fixed inside the substantially U-shaped terminal main body portions 121a and 122a of main electrode terminals 121 and 122. Nuts 221 and 222 of case insertion member 220 are disposed below the upper end portions of terminal main body portions 121a and 122a exposed from case main body portion 210, as shown in FIG. 12(B).

Meanwhile, in circuit assembly 100 of the second example, the kind of main electrode terminal 123, described in the first example, which is mounted on the C2 terminal (C2E1 terminal) of second DCB substrate 140B is not provided. Because of this, the nut of case insertion member 220 corresponding to the position of opening portion 213a is exposed in opening portion 213a of case main body portion 210. Case insertion member 220 and the nut thereof are disposed in the position of opening portion 213a in this way, thereby avoiding opening portion 213a being closed and a portion of circuit assembly 100 below opening portion 213a being exposed to the exterior. Furthermore, as it is the nut that is exposed, it is easily recognized that the portion is not for the electrode terminals.

Exterior case 200 is configured separately from main electrode terminals 121 and 122 and auxiliary electrode terminals 124 and 125. Circuit assembly 100 of the second example is arranged so that it is possible to use exterior case 200 having the same configuration even when there is no more need for main electrode terminal 123 or auxiliary electrode terminals 126 and 127, as in the first example.

It is preferable that chips 150, DCB substrates 140, and wires 160 of circuit assembly 100 are sealed with a sealing resin after the mounting of case main body portion 210 on circuit assembly 100 and before (or after) the insertion of case insertion member 220.

Semiconductor module 1 is arranged so as to be also able to include, apart from circuit assembly 100 having the kind of configuration described as the first example, circuit assembly 100 having the kind of configuration described as the second example, using common parts with those of circuit assembly 100 of the first example. Semiconductor module 1 is a so-called 1-in-1 module wherein first DCB substrate 140A and second DCB substrate 140B on each of which are mounted the IGBTs 151 and FWDs 152 are connected in parallel.

The assembly of semiconductor module 1 including the kind of circuit assembly 100 in the second example is carried out in the kind of procedure shown in FIGS. 2, 8, 11, and 12. That is, firstly, DCB substrates 140 and chips 150 are disposed on heat dissipation base 110 (chips 150 are disposed after DCB substrates 140 have been disposed on heat dissipation base 110, or DCB substrates 140 with chips 150 disposed thereon are disposed on heat dissipation base 110), as in FIG. 2. Further, wire bonding is carried out as in FIG. 8, the electrode terminals 120 are mounted as in FIG. 11, and exterior case 200 is mounted as in FIG. 12. By so doing, it is possible to obtain semiconductor module 1 (1-in-1 module) including circuit assembly 100 having the parallel-connected circuit.

As heretofore described, in semiconductor module 1, the two DCB substrates 140 on heat dissipation base 110, chips 150 mounted on DCB substrates 140, and the connection of DCB substrates 140 and chips 150 by wires 160 are not changed, and the connection between the two DCB substrates 140 by wires 160 is changed. By changing the connection between the two DCB substrates 140 by wires 160, semiconductor module 1 adopts the type (2-in-1 module) including circuit assembly 100 having the kind of series-connected circuit (FIG. 4) shown in the first example, or adopts the type (1-in-1 module) including circuit assembly 100 having the kind of parallel-connected circuit (FIG. 10) shown in the second example.

For example, when rated voltage is set to 1200V and rated current is set to 200 A when circuit assembly 100 is taken to have the series-connected circuit (the 2-in-1 module), the rated voltage is 600V and the rated current is 400 A when circuit assembly 100 is taken to have the parallel-connected circuit (the 1-in-1 module). By changing the wire bonding between DCB substrates 140 in this way, circuits with different functions are realized.

Further, in accordance with the type of circuit assembly 100, electrode terminals 120 are mounted in their respective predetermined terminal positions on circuit assembly 100. When the series-connected circuit is adopted as the circuit of circuit assembly 100, three main electrode terminals 121 to 123 and four auxiliary electrode terminals 124 to 127 are mounted (FIG. 5), and when the parallel-connected circuit is adopted, two main electrode terminals 121 and 122 and two auxiliary electrode terminals 124 and 125 are mounted (FIG. 11).

Semiconductor module 1 is such that the number of electrode terminals 120 mounted and the kind of electrode terminals 120 exposed to the exterior after the mounting of exterior case 200 differ depending on whether circuit assembly 100 is set to have the series-connected circuit or the parallel-connected circuit. However, the same electrode terminals 120 mounted in the same terminal positions are used in both circuit assembly 100 having the series-connected circuit and circuit assembly 100 having the parallel-connected circuit. Also, the same exterior case 200 mounted after mounting the electrode terminals 120 is also used in both circuit assembly 100 having the series-connected circuit and circuit assembly 100 having the parallel-connected circuit.

In this way, semiconductor module 1 is such that even when realizing circuits with different functions, it is not necessary to change parts themselves to be used (heat dissipation base 110, DCB substrates 140, chips 150, electrode terminals 120, and exterior case 200), and it is sufficient to change the wire bonding between DCB substrates 140. That is, it is possible to share the parts to be used, no matter which type semiconductor module 1 adopts, the 2-in-1 module or the 1-in-1 module.

As an example of the method of manufacturing the 2-in-1 module and 1-in-1 module, there is a method of changing the conductor patterns of the DCB substrates for each of these module types, or changing the wire bonding of the chips and conductor patterns along with the change of the conductor patters. Alternatively, there is also a method of preparing electrode terminals of different shapes for respective module types, or preparing an exterior case in accordance with the electrode terminals to be used.

As opposed to this, in the heretofore described semiconductor module 1, the parts to be used are shared, and the way of wire bonding between DCB substrates 140 is changed depending on which type is to be adopted, the 2-in-1 module or the 1-in-1 module. Consequently, with semiconductor module 1, it is possible to suppress the cost necessary for materials, and furthermore, possible to suppress the cost necessary for assembly, compared with when preparing parts corresponding to each of the module types. Also, when manufacturing semiconductor module 1, it is not necessary to stock many kinds of parts, and not only it is possible to achieve a reduction in the cost necessary for this kind of stock of parts and a reduction in the burden of control of the parts in stock, but it is also possible to achieve a reduction in lead time owing to the sharing of parts.

The above description has illustrated a case in which two DCB substrates joined to the top of the heat dissipation base are formed in the same configuration, and the same configuration is also used for the chips mounted on one of the two DCB substrates and the chips mounted on the other. In addition to this, it is also possible to use two DCB substrates different in configuration, or to use chips mounted on one of two DCB substrates and chips mounted on the other which are different in configuration. It is possible to fabricate the 2-in-1 module and 1-in-1 module in distinction from each other by changing the way of wire bonding between the DCB substrates, and it is possible to obtain the same advantages as heretofore described as long as parts are shared both when adopting the 2-in-1 module and when adopting the 1-in-1 module.

Also, in the above description, the wire bonding between the two DCB substrates on the heat dissipation base has been described as an example, but the number of DCB substrates is not limited to two. An arrangement may be such that modules wherein circuits with different functions are configured are realized by joining three or more DCB substrates to the top of the heat dissipation base and changing the way of wire bonding among these DCB substrates.

It is desirable that conductor patterns are formed on DCB substrates to be used so that it is possible to fabricate modules in distinction from each other by changing the way of wire bonding, and the shape and mounting positions of electrode terminals to be used are not changed even when the module type differs.

Figure 13:
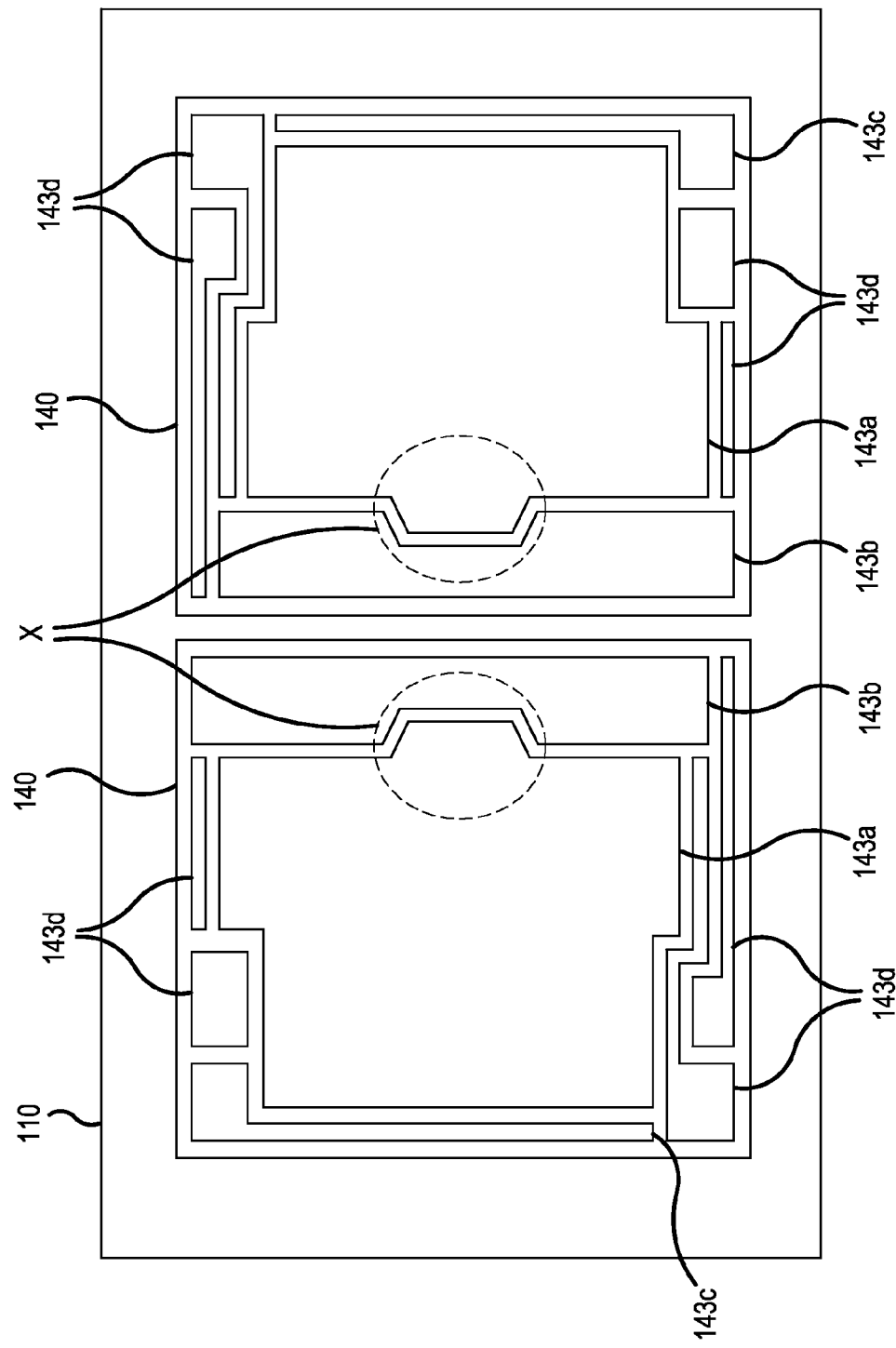
FIG. 13 is a diagram showing a modification example of the conductor patterns of the DCB substrates.

FIG. 13 is a diagram showing a modification example of the conductor patterns of the DCB substrates.

For example, when two DCB substrates 140 of the same configuration are disposed in an orientation in which one is rotated 180° relative to the other, their respective first main conductor patterns 143a may be expanded in opposite directions facing each other as in X portions, as shown in FIG. 13. By providing these kinds of first main conductor patterns 143a, it is possible to secure regions for carrying out wire bonding, easily carry out the wire bonding of the E1 terminal and C2 terminals described in the first example, and easily carry out the wire bonding of the C1 terminals and C2 terminals described in the second example. It is possible to carry out any kind of connection using a metal conductor such as copper, or the like, apart from the wire bonding.

A description has heretofore been given of the embodiment of the semiconductor module, but various changes can be made to the heretofore described embodiment without departing from the scope of the embodiment.

The above description simply illustrates the principle of the invention. Furthermore, a great number of modifications and alterations are possible for those skilled in the art, and the invention not being limited to the heretofore illustrated and described exact configurations and applications, all corresponding modification examples and equivalents are deemed to be within the scope of the invention defined by the attached claims and the equivalents thereof.

Thus, a semiconductor device and a manufacturing method thereof has been described according to the present invention. Many modifications and variations may be made to the devices and methods described and illustrated herein without departing from the spirit and scope of the invention. Accordingly, it should be understood that the devices and methods described herein are illustrative only and are not limiting upon the scope of the invention.

REFERENCE SIGNS LIST

1 Semiconductor module
100 Circuit assembly
110 Heat dissipation base
120 Electrode terminal
121, 122, 123 Main electrode terminal
124, 125, 126, 127 Auxiliary electrode terminal 121a, 122a, 123a, 124a, 125a, 126a, 127a Terminal main body portion
121b, 122b, 123b, 124b, 125b, 126b, 127b Leg portion
130 Solder layer
140 DCB substrate
140A First DCB substrate
140B Second DCB substrate
141 Insulating substrate
142, 143 Conductor pattern
143a First main conductor pattern
143b Second main conductor pattern
143c Third main conductor pattern
143d Auxiliary conductor pattern
150 Chip
151 IGBT
152 FWD
160 Wire
200 Exterior case
219 Case main body portion
211a, 212a, 213a, 214a, 215a, 216a, 217a Opening portion
220 Case insertion member
221, 222, 223 Nut

What is claimed is:

1. A semiconductor device, comprising:
a heat dissipation base;
a first substrate, disposed on the heat dissipation base, which has a first conductor pattern;
a second substrate, disposed on the heat dissipation base, which has a second conductor pattern;
a first semiconductor element, disposed on the first substrate, which has on the first conductor pattern a first collector terminal and a first emitter terminal;
a second semiconductor element, disposed on the second substrate, which has on the second conductor pattern a second collector terminal and a second emitter terminal;
a plurality of electrode terminals, wherein
in a first case in which the first emitter terminal and the second collector terminal are wired together, different ones of the electrode terminals are connected to the first collector terminal, the second emitter terminal, and the second collector terminal, and
in a second case in which the first collector terminal and the second collector terminal are wired together and the first emitter terminal and the second emitter terminal are wired together, different ones of the electrode terminals are connected to the first collector terminal and the second emitter terminal; and
a common exterior case which covers the heat dissipation base with one portion of each of the connected electrode terminals exposed in both the first case and second case.

2. The semiconductor device according to claim 1, wherein
the first conductor pattern includes a first pattern used as the first collector terminal and a second pattern used as the first emitter terminal,
the second conductor pattern includes a third pattern used as the second collector terminal and a fourth pattern used as the second emitter terminal, and
in the first case, the second pattern and third pattern are wire connected together, while in the second case, the first pattern and third pattern are wire connected together, and the second pattern and fourth pattern are wire connected together.

3. The semiconductor device according to claim 1, wherein the exterior case further comprises:
a main body portion having a first opening portion, second opening portion, and third opening portion provided so that one portion of each of the electrode terminals connected to the first collector terminal, second emitter terminal, and second collector terminal is exposed; and
an insertion member, inserted into the main body portion, which closes the third opening portion when the electrode terminal is not connected to the second collector terminal.

4. The semiconductor device according to claim 1, further comprising:
auxiliary electrode terminals which are electrically connected one each to the first emitter terminal and second emitter terminal in the first case, and which are electrically connected to the first emitter terminal in the second case, wherein one portion of each of the connected auxiliary electrode terminals is exposed from the exterior case.

5. The semiconductor device according to claim 1, wherein:
the first semiconductor element has a first gate terminal on the first conductor pattern,
the second semiconductor element has a second gate terminal on the second conductor pattern, and
in the second case, the first gate terminal and second gate terminal are wired together, and a gate electrode terminal, electrically connected to the first gate terminal and second gate terminal, one portion of which is exposed from the exterior case, is provided.

6. A semiconductor manufacturing method, comprising:
a step of disposing on a heat dissipation base a first substrate having a first conductor pattern;
a step of disposing on the heat dissipation base a second substrate having a second conductor pattern;
a step of disposing on the first substrate a first semiconductor element having a first emitter terminal and a first collector terminal on the first conductor pattern;
a step of disposing on the second substrate a second semiconductor element having a second emitter terminal and a second collector terminal on the second conductor pattern;
a step of wiring the first emitter terminal and second collector terminal together, or wiring the first collector terminal and second collector terminal together, and wiring the first emitter terminal and second emitter terminal together;
a step of connecting a plurality of electrode terminals, one each, to the first collector terminal, second emitter terminal, and second collector terminal in a first case in which the first emitter terminal and second collector terminal are wired together, and one each, to the first collector terminal and second emitter terminal in a second case in which the first collector terminal and second collector terminal are wired together, and the first emitter terminal and second emitter terminal are wired together; and
a step of covering the heat dissipation base with a common exterior case, with one portion of each of the connected electrode terminals exposed, in both the first case and second case.

7. The semiconductor device manufacturing method according to claim 6, wherein:
the first conductor pattern includes a first pattern used as the first collector terminal and a second pattern used as the first emitter terminal,
the second conductor pattern includes a third pattern used as the second collector terminal and a fourth pattern used as the second emitter terminal, and in the wiring step, in the first case, the second pattern and third pattern are wire connected together, while in the second case, the first pattern and third pattern are wire connected together, and the second pattern and fourth pattern are wire connected together.

8. The semiconductor device manufacturing method according to claim 6, wherein the exterior case comprises:
a main body portion having a first opening portion, second opening portion, and third opening portion provided so that one portion of each of the electrode terminals connected to the first collector terminal, second emitter terminal, and second collector terminal is exposed; and
an insertion member, inserted into the main body portion, which closes the third opening portion when the electrode terminal is not connected to the second collector terminal, and
the step of covering the heat dissipation base with the exterior case includes:
a step of covering the heat dissipation base with the main body portion after the connection of each electrode terminal; and
a step of inserting the insertion member into the main body portion.

9. The semiconductor device manufacturing method according to claim 6, further comprising:
a step of electrically connecting auxiliary electrode terminals, one each, to the first emitter terminal and second emitter terminal in the first case, and electrically connecting the auxiliary electrode terminals to the first emitter terminal in the second case, wherein, in the step of covering the heat dissipation base with the exterior case, the heat dissipation base is covered with the exterior case with one portion of each of the connected auxiliary electrode terminals exposed.

10. The semiconductor device manufacturing method according to claim 6, wherein the first semiconductor element has a first gate terminal on the first conductor pattern, and the second semiconductor element has a second gate terminal on the second conductor pattern, the method comprising:
in the second case, a step of wiring the first gate terminal and second gate terminal together; and
a step of disposing a gate electrode terminal electrically connected to the first gate terminal and second gate terminal, the method being characterized in that in the step of covering the heat dissipation base with the exterior case, the heat dissipation base is covered with the exterior case with one portion of the connected gate electrode terminal exposed.

* * * * *